US006478994B1

United States Patent
Sneddon et al.

(10) Patent No.: US 6,478,994 B1
(45) Date of Patent: Nov. 12, 2002

(54) METHOD FOR MAKING BORON CARBIDE CONTAINING CERAMICS

(75) Inventors: Larry G. Sneddon, Newtown Square, PA (US); Mark J. Pender, Philadelphia, PA (US)

(73) Assignee: Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 09/539,182

(22) Filed: Mar. 30, 2000

(51) Int. Cl.$^7$ .......................... C23C 16/32; C01B 31/36; B29C 65/00
(52) U.S. Cl. ...................... 264/43; 264/625; 423/291; 427/249.5
(58) Field of Search .................. 264/43, 625, 628; 423/291; 427/249.5

(56) References Cited

U.S. PATENT DOCUMENTS

| | | | |
|---|---|---|---|
| 3,154,520 A | * | 10/1964 | Dupont et al. |
| 4,012,474 A | | 3/1977 | Sowman et al. |
| 4,026,993 A | * | 5/1977 | Ditter et al. |
| 4,810,436 A | | 3/1989 | Johnson |
| 4,832,895 A | * | 5/1989 | Johnson |
| 4,946,713 A | | 8/1990 | Sneddon et al. |
| 5,223,461 A | | 6/1993 | Riccitiello et al. |
| 5,502,142 A | | 3/1996 | Sneddon |
| 5,508,120 A | | 4/1996 | Pyzik et al. |

OTHER PUBLICATIONS

Wideman, T.; Remsen, E.E.; Cortez, E.; Chlanda, V.L.; and Sneddon, L.G., "Amine–Modified Polyborazylenes: Second–Generation Precursors to Boron Nitride," *Chem. Mater.*, vol. 10, No. 1, 1988, pp. 412–421.

Yang, X.; Stern, Charlotte L.; and Marks, T.J., "Cationic Zirconocene Olefin Polymerization Catalysts Based on the Organo–Lewis Acid Tris(pentafluorophenyl)borane. A Synthetic, Structural, Solution Dynamic, and Polymerization Catalytic Study," *J. Am. Chem. Soc.*, 1994, vol. 116, No. 22, 1994, pp. 10015–10031.

Seyferth, D. and Rees, William S., Jr., "Preparation, Characterization, and Pyrolysis of [$-B_{10}H_{12}$•diamine]—$n$ Polymers: A New Route to Boron Nitride," *Chem. Mater.*, vol. 3, No. 6, 1991, pp. 1106–1116.

Riedel, R., "Hydroboration of polymethylvinylsilane—a novel route to silicon boron carbide ceramics," *Journal of Material Science*, vol. 28 (1993), pp. 3931–3938.

(List continued on next page.)

Primary Examiner—Christopher A. Fiorilla
(74) Attorney, Agent, or Firm—RatnerPrestia

(57) ABSTRACT

A method for making a boron carbide containing ceramic involves pyrolyzing a precursor having one or more monosubstituted decaboranyl groups and at least one substituting group containing carbon. The precursor may be molecular, for example comprising two decaboranyl groups linked by a single substituting group, or polymeric, in which case the decaboranyl groups are part of the pendant group of the polymer while a portion of the substituting group makes up the polymer backbone. In either case, the substituting group may be a hydrocarbon, in which case boron carbide may be formed. Alternatively, the substituting group may contain carbon and another ceramic forming element (i.e., other than boron or carbon), such as silicon, nitrogen, or phosphorous, in which case a composite including boron carbide is formed. The precursors used in the present invention are relatively stable in air, allow access to both boron rich and carbon rich materials, and further allow for the formation of films, fibers, and nanostructured materials more easily than other precursors.

30 Claims, 3 Drawing Sheets

OTHER PUBLICATIONS

Packirisamy, S., "Decaborane(14)–Based Polymers," *Prog. Polym. Sci.,* vol. 21, 1996, pp. 707–773.

Thevenot, F., "A Review on Boron Carbide," *Key Engineering Materials,* vols. 56–57 (1991), pp. 59–88.

Moss, T.S.; Lackey, W.J.; and More, K.L., "Chemical Vapor Deposition of $B_{13}C_2$ from $BCl_3$—$CH_4$—$H_2$—Argon Mixtures," *J. Am. Ceram. Soc.,* vol. 81, No. 12, pp. 3077–3086.

Goller, G.; Toy, C.; Tekin, A.; and Gupta, C.K., "The Production of Boron Carbide by Carbothermic Reduction," vol. 15, Nos. 1–2, 1996, pp. 117–122.

Bose, D.K.; Nair, K.U; and Gupta, C.K., "Production of High Purity Boron Carbide," *High Temperature Materials and Porcesses,* vol. 7, Nos. 2 & 3, 1986, pp. 133–140.

Zheng, Haixing; Thorne, K.; and Mackenzie, D.J., "Boron Carbide–Based Ceramics Via Polymer Route Synthesis," *Mat. Res. Soc. Symp. Proc.,* vol. 249, 1992, pp. 15–23.

Yang, X.; Johnson, S.; and Hawthorne, M. F., "Design and Synthesis of Chemical Precursors to Boron Carbide," *Mat. Res. Soc. Symp. Proc.,* vol. 271, 1992, pp. 827–838.

McNally, L. and Allen, C.W., Polymerization of Vinyl Derivatives of the Main Group Elements, *Heteroatom Chemistry,* vol. 4, No. 2/3, 1993, pp. 159–173.

Johnson, S.A.; Olliver, P.J.; and Mallouk T.E., "Ordered Mesoporous Polymers of Tunable Pore Size from Colloidal Silica Templates," *Science,* vol. 283, Feb. 12, 1999, pp. 963–965.

Zhang, D.; McIlroy, D.N.; Geng, Y.; and Norton, M.G., "Growth and characterization of boron carbide nonowires," *Journal of Materials Science Letters,* vol. 18, 1999, pp. 349–351.

Han, W.; Bando, Y.; Kurashima, K.; and Sato, T., "Boron–doped carbon nanotubes prepared through a substitution reaction," *Chemical Physics Letters,* vol. 299, 1999, pp. 368–373.

Pender, M.J.; Wideman, T.; Carroll, P.J.; and Sneddon, L.G., "Transition Metal Promoted Reactions of Boron Hydrides. 15. Titanium–Catalyzed Decaborane–Olefin Hydroborations: One–Step, High–Yield Syntheses of Monoalkyldecaboranes," *J. Am. Chem. Soc.,* vol. 120, 1998, pp. 9108–9109.

* cited by examiner

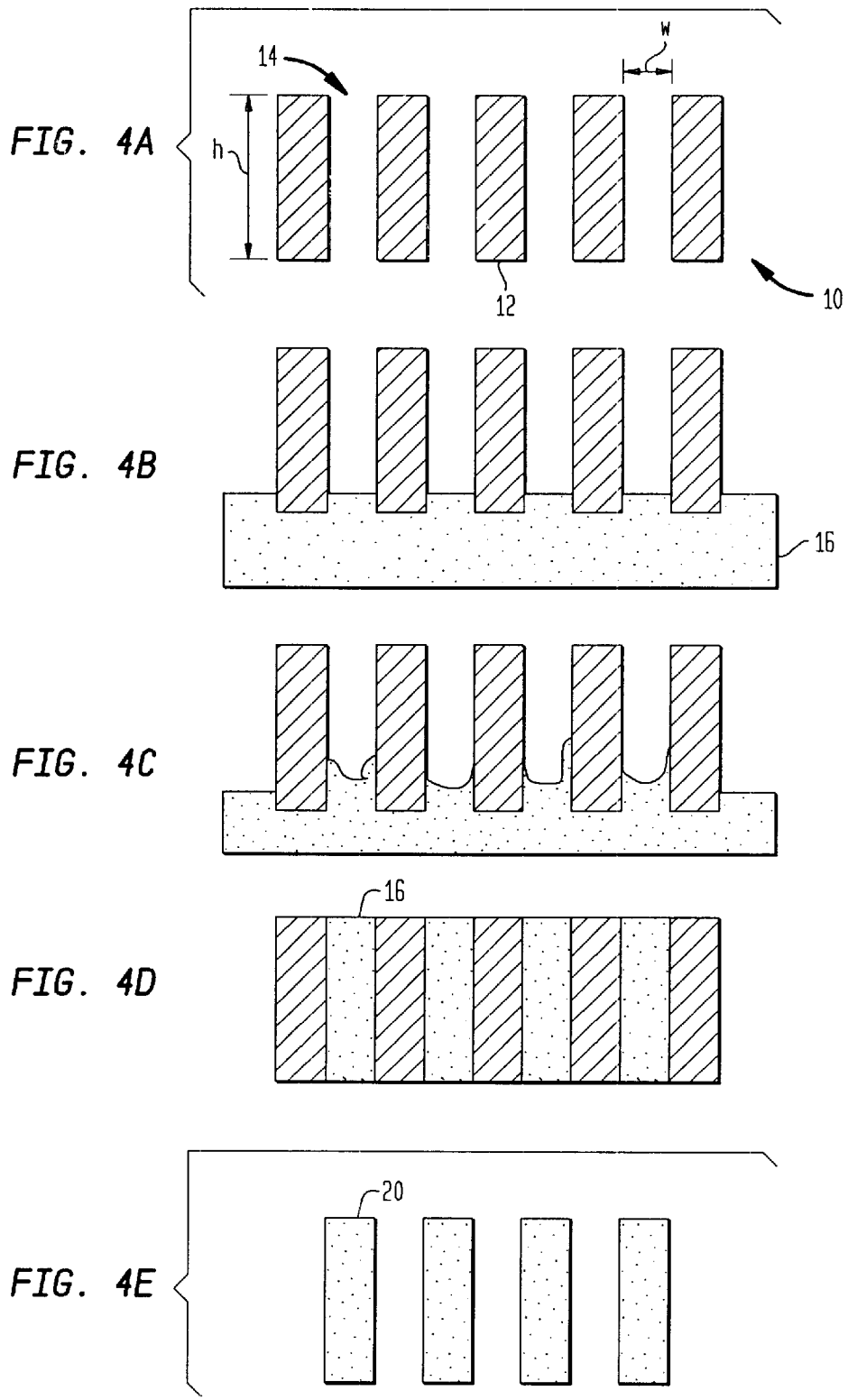

METHOD FOR MAKING BORON CARBIDE CONTAINING CERAMICS

FIELD OF THE INVENTION

The present invention pertains to the synthesis of boron carbide containing ceramics and particularly to the use of certain nonvolatile and easily-processed precursors of such ceramics.

BACKGROUND OF THE INVENTION

Boron carbide is a highly refractory material that is of great interest for both its structural and electronic properties. The boron carbide structure is composed of icosahedral units that are linked by both direct covalent bonds and by three-atom chains. The most widely accepted structural model for $B_4C$ ($B_{12}C_3$) has $B_{11}C$ icosahedra with C-B-C intericosahedral chains. However, single phase boron carbides are also known with carbon concentrations ranging from 8.8 to 20 atomic %, and localized phases of varying composition may exist in a single material. This range of concentrations is made possible by the substitution of boron and carbon atoms for one another within both the icosahedra and the three-atom chains.

Particularly important properties of boron carbide include its high-temperature stability, high hardness, high cross-section for neutron capture, and excellent high-temperature thermoelectric properties. This combination of properties gives rise to numerous applications, including uses as an abrasive wear-resistant material, ceramic armor, a neutron moderator in nuclear reactors, and, potentially, for power generation in deep space flight applications.

Various synthetic processes of a variety of forms of boron carbide are known. For example, boron carbide powders can be made by a number of reactions. One such reaction is the carbothermal reduction of boric oxides at high temperatures and high pressures. Coatings can be made by chemical vapor deposition using a gaseous mixture of a boron source (such as a boron halide, borane, or diborane) and a carbon source (such as methane or chloroform), typically in the presence of hydrogen. Recently, Zhang et al discussed the important of nanoscale boron carbide materials and demonstrated the use of plasma-enhanced chemical vapor deposition to generate boron carbide nanowires and nanonecklaces. Han et al. have also recently reported the formation of mixtures of crystalline boron carbide nanorods and boron-doped nanotubes upon the reaction of boron oxide vapor with carbon nanotubes.

As mentioned above, boron carbide has a high cross-section for neutron capture. More specifically, the $^{10}B$ isotope is an effective neutron radiation absorber that degrades into relatively innocuous materials. As a result, the highly refractory ceramic boron carbide has been incorporated into emergency shutdowns balls for nuclear reactors. Subsequent findings have shown, however, that boron carbide is too sensitive to oxidation at higher temperatures. Recent efforts have been made to increase the oxidation resistance of these shutdown balls by making $B_4C/SiC/C$ composites. These materials should exhibit the oxidative stability of SiC, but still have the neutron absorbing properties of $B_4C$. Such composites have already proven to be oxidatively stable up to 1200° C.

Of particular interest is the formation of boron carbide ceramic fibers. Because of their low density, high strength, high temperature stability (up to 2300° C.), high modulus of elasticity, chemical inertness, hardness and electrical conductivity, boron carbide fibers have many potential uses in harsh environments. Boron carbide fibers have previously been made by complex processes, such as the boriding of carbon fibers by their reaction with $BCl_3$ and $H_2$. Thus, the development of a single-source precursor to such fibers would be a major advance. Previous efforts include the successful development of melt-spinnable polymeric precursors to SiC, $Si_3N_4$, BN and SiNCB ceramic fibers.

Ideally, a chemical precursor which can be processes into form such as films and fibers, including nanoscale structures, may be used to make boron carbide containing ceramics. This requires, however, the development of such precursors which can be processed. For example, once dissolved in a suitable solvent, ceramic precursors which can be processed can be applied as thin films to substrates then pyrolyzed to yield thin ceramic films. Such dissolved precursors may also be applied to substrates by various dipping or spraying techniques or could be dry spun to form polymer fibers that could be converted to ceramic fibers upon pyrolysis. Such ceramic fibers could also be made by extrusion of polymer melts to form polymer fibers, followed by pyrolytic conversion to the ceramic fiber. In addition, such precursors could be formed into molded monoliths, if desired.

Some attempts have been made to develop such precursors which can be easily processed. For example, U.S. Pat. No. 4,946,713, assigned to the assignee of this patent application, describes the use of poly(alkenylpentaborane) as a precursor to boron carbide and other ceramic materials. Due to the high reactivity of the $B_5H_8$ substituent, however, this precursor is thermolytically and hydrolytically unstable, rendering it difficult to use commercially. Seyferth has shown that decaborane-diamine and decaborane-diphosphine polymers can be pyrolyzed to form boron nitride and boron phosphide, respectively, mixed with boron carbide and graphite.

In view of the shortcomings of the prior art described above, it is desirable to develop or identify efficient, stable precursors which can be processed and which form substantially pure ceramic materials. It is also desirable for a ceramic precursor to provide, with only slight modifications to the precursor, different ceramic materials (e.g., boron carbide versus a boron carbide/silicon carbide composite) or the same ceramic material but with a range of variable chemical compositions and thus variable physical properties (e.g., boron carbide having 78.25 weight percent boron versus boron carbide having 85.4 weight percent boron). In particular, some of the characteristics of born carbide are known to vary with changes in the relative weight (or atomic) percent of boron and carbon. For example, as the atomic percent of boron increases, the neutron absorption capability of the boron carbide ceramic improves; on the other hand, as the atomic percent of carbon increases to 13.3%, the thermoelectric properties of the boron carbide ceramic improve. Likewise, the hardness of the material increases with an increasing atomic percent of carbon up to the saturation limit of 20%. Thus, it would be desirable to vary the atomic percent of boron and carbon of a boron carbide ceramic depending on the particular application and desired properties.

SUMMARY OF THE INVENTION

The present invention provides a method for making a boron carbide containing ceramic. The method involves forming a precursor comprising at least one monosubstituted decaboranyl group and at least one substituting group containing carbon and pyrolyzing the precursor to form the ceramic product. The precursor may be a molecular precursor comprising one or two decaboranyl groups bridged by a single substituting group or a polymeric precursor having a polymeric backbone of a portion of the substituting group and pendant groups each including one or more decaboranyl groups.

The method of the present invention can be used to make a variety of ceramics. For example, if the substituting group is a hydrocarbon with no other elements, the resulting ceramic product may be boron carbide. Alternatively, if the substituting group is a hydrocarbon with at least one other ceramic forming element, the resulting ceramic product may be a composite containing boron carbide and another ceramic material. In addition, the pyrolysis gas can either be an inert gas, such as argon, or a reactive gas, such as ammonia. In the event that a reactive gas is used, a ceramic composite may be formed by utilizing a ceramic forming element from the reactive gas, even if the substituting group consists solely of a hydrocarbon.

The present invention also provides a polymeric precursor for making a boron carbide containing ceramic comprising a polymeric backbone and a plurality of pendant groups having at least one monosubstituted decaboranyl group. Exemplary polymeric precursors include polyhexenyldecaborane and a copolymer formed by the copolymerization of hexenyldecaborane and allyltrimethylsilane.

The present invention also contemplates the use of the precursor of the present invention to make a variety of forms of boron carbide containing ceramics.

The precursor of the present invention can be dissolved in various organic solvents and/or melted and, in these states, can be used to prepare fibers (including melt spun fibers), coatings, and films (including spun cast films) of boron carbide containing ceramics as well as nanostructures such as nanofibers, nanocylinders, and nanoporous structures.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures:

FIG. 4a through 4e are schematic representations showing certain aspects of a process for forming ceramic nanofibers.

DETAILED DESCRIPTION OF THE INVENTION

The present invention is directed to a process for making boron carbide containing ceramics. As used herein, the phrase "boron carbide containing ceramics" shall mean any ceramic material including boron carbide, such as boron carbide itself and composites containing boron carbide and at least one other ceramic. As used herein, the term "boron carbide" encompasses pure boron carbide as well as boron carbide/carbon composites. Composites containing boron carbide and at least one other ceramic include boron carbide/boron nitride; boron carbide/silicon carbide; and boron carbide/boron phosphide.

Figure 1:
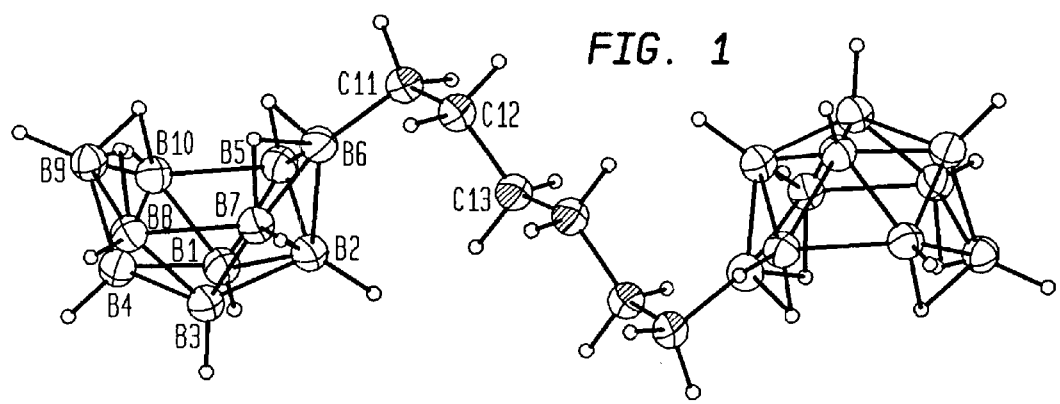
FIG. 1 is an ORTEP representation of the structure of 6,6'-$(CH_2)_6$-$(B_{10}H_{13})_2$.

As used in the art, the term decaborane refers to two compounds, namely decaborane (14) having a chemical formula of $B_{10}H_{14}$ and decaborane (16) having a chemical formula of $B_{10}H_{16}$ and consisting of two $B_5H_8$ compounds fused together. For convenience, the term "decaborane" as used herein shall refer solely to decaborane (14), and a "monosubstituted decaboranyl group" shall refer to a boron hydride having the molecular formula $-B_{10}H_{13}$ in which a single substituting group has supplanted one of the hydrogen atoms of decaborane and is bonded to a boron atom. The structure of a monosubstituted decaboranyl group is shown at FIG. 1. The decaboranyl group is the cage including the ten boron atoms labeled $B_1$ through $B_{10}$ and their associated hydrogen atoms. The synthesis of a decaborane group or "cage" ($B_{10}H_{14}$) is well-known.

The method for making boron carbide containing ceramics according to the present invention is carried out in order in the following two general steps:

1) form a precursor having at least one monosubstituted decaboranyl groups and at least one substituting group containing carbon; and 2) pyrolyze the precursor to form the boron carbide containing ceramic.

The details of these two general steps are discussed in more detail below.

The precursor having at least one, and preferably a plurality (i.e., two or more), of monosubstituted decaboranyl groups and at least one substituting group can be made in a number of ways. The precursor may be either molecular or polymeric. The molecular shown in FIG. 1 is one of the two independent molecules formed by a method described in an article by Pender et al., "Transition Metal Promoted Reactions of Boron Hydrides. 15. Titanium-Catalyzed Decaborane- - - Olefin Hyrdroborations: One-Step, High-Yield Syntheses of Monoalkyldecaboranes," J. Am. Chem. Soc. Vol. 120, No. 35, pp. 9108 and 9109. The two independent molecules differ from one another only in the conformation of the linking chain or substituting group.

In this article, the authors describe that decaborane-olefin hydroboration reactions employing catalytic amounts of $Cp_2Ti(CO)_2$ yield exclusively monosubstituted decaboranes, 6-$(RC_2H_4)B_{10}H_{13}$. Such reactions may be carried out without solvent at 80° C. to 90° C. in an excess of olefin and about 5 mol % catalyst and give greater than 90% isolated yields. The catalyst is also active for a long period. For example, $^{11}B$ NMR analysis of an experiment where about 10 mmol samples of decaborne were added ca. every 2 days (total decaborane added, 7.11 g, 58.2 mmol) to a reaction mixture containing 0.24 mmol of $Cp_2Ti(CO)_2$ (0.41 mol %) and an excess of 1-octene (39.0 mL, 249 mmol) showed no decrease in the rate of formation of alkyl product over 12 days. This monosubstituted decaborane having only one decaboranyl group, 6-$(RC_2H_4)B_{10}H_{13}$, may be used as a precursor in a variety of methods, such as in chemical vapor deposition, for making boron carbide containing ceramics.

This article also reported that the titanium-catalyzed reactions of decaborane with non-conjugated diolefins such as 1,5-hexadiene give, depending upon reaction conditions and stoichiometries, high yields of either alkenyl-substituted (88%) or linked-cage products (92%), the latter of which melts without decomposition at 96° C. and has a B:C ration of 4:1.2, close to that of boron carbide. These reactions are shown below:

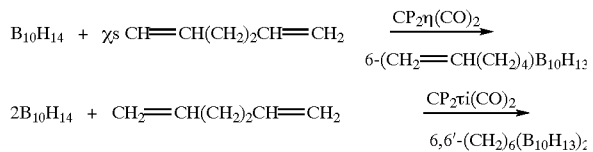

A single-crystal X-ray study of 6,6'-(CH$_2$)$_6$(B$_{10}$H$_{13}$)$_2$ has confirmed the linked-cage structure shown in the ORTEP representation of FIG. 1 in which the two decaborane cages are joined by the 6-carbon chain that is attached to the 6-boron vertex on each cage.

As described above, a molecular precursor of the present invention has two monosubstituted decaboranyl groups linked by a single substituting group. The substituting group above is a six carbon alkyl group, but could be any other suitable hydrocarbon (i.e., consisting exclusively of carbon and hydrogen) such as an alkyl group, a cycloalkyl group, an aryl group, an alkenyl group, or a dialkenyl group. The substituting group may comprise any suitable number of carbon atoms, such as from one to twelve, or, more preferably and depending on the desired properties of the ceramic product, between two and eight. For example, 1,5-hexadiene was used to form the structure shown in FIG. 1, but other diolefins could be used, such as 1,4 pentadiene or 1,7-octadiene. Moreover, the substituting group may contain boron atoms. Regardless of whether the substituting group is only a hydrocarbon or also contains boron atoms, the resulting pyrolysis product is boron carbide, so long as an inert pyrolysis gas is used (as described below). By varying the number of carbon atoms in the substituting group, the relative weight percentages of boron and carbon in the ceramic product are varied; in this way, the properties of a boron carbide ceramic may be altered slightly in order to meet the needs of certain applications. For boron carbide with a B:C ratio of close to 4:1, it is desirable to have two or three carbon atoms for every decaboranyl group.

Alternatively, the substituting group may include a hydrocarbon and also at least one "additional ceramic forming element." As used herein, the phrase "additional ceramic forming element" includes elements which are constituents of ceramics other than carbon and boron. Such additional ceramic forming elements may include, for example, phosphorous, silicon and nitrogen. The substituting group may contain silicon and result in a molecular precursor having two monosubstituted decaboranyl groups linked by a hydrocarbon group and a silane group. An exemplary molecular precursor with a substituting group comprising a hydrocarbon and silicon is dimethylsilane dipropyldecaboranyl, which has a formula of 6,6'(CH$_3$)$_2$Si ((CH$_2$)$_3$–B$_{10}$H$_{13}$)$_2$. Such a precursor is formed by the Cp$_2$Ti (CO)$_2$ catalyzed hydrocarbon of diallyldimethylsilane, as described below in Example 2, and results in the formation of a composite containing boron carbide and silicon carbide. The substituting group may also include two or more additional ceramic forming elements to form composites of multiple ceramics including boron carbide, such as boron carbide/boron nitride/silicon nitride.

As mentioned above, the precursor may be a polymeric precursor which includes a polymeric backbone and a plurality of pendant groups. The pendant group of each repeating unit of the polymeric precursor includes one or more decaboranyl groups. In the embodiments shown below, the pendant group also includes a portion of the substituting group and a single decaboranyl group. In addition, the polymeric backbone of the polymeric precursor is made up of another portion of the substituting group. Although the examples below show only one decaboranyl group per each repeating unit, it is possible to have more than one decaboranyl group per repeating unit. An example is triallyl (methyl)silane as the substituting group, in which two of the three allyls have a decaboranyl group attached thereto and the third allyl group may remain free for polymerization. The molecular weight of the polymeric precursor may vary over a wide range and depends on the particular application. No particular molecular weight or range of molecular weight appear to be critical for operation of the present invention. The molecular weight and the glass transition temperature of the precursor may be tuned depending on the particular application.

In order to make a polymeric precursor according to the present invention, a diolefin, such as 1,5-hexadiene, is first reacted in excess with decaborane in the presence of a Cp$_2$Ti(CO)$_2$ catalyst as described in the Pender et al. article cited above. More specifically, these reactants yield the hexenyl-substituted derivative, 6-CH$_2$=CH–(CH$_2$)$_4$–B$_{10}$H$_{13}$, in high yield (88%) with reaction conditions of 90° C. for 24 hours in the presence of 5 mol % catalyst. This hexenyl-substituted derivative can be polymerized by any suitable catalyst known to promote olefin polymerization. As shown by the equation below, the hexenyl-substituted derivative may be catalyzed using a Cp$_2$ZrMe$_2$/B(C$_6$F$_5$)$_3$ catalyst system to yield a polymeric precursor comprising a polyolefin backbone (in this case, a two carbon alkyl group in the repeating unit) and a plurality of pendant groups comprising a decaboranyl group linked to the backbone by a four carbon alkyl group.

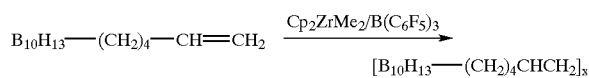

Polymerization may be carried out over a wide range of conditions depending on the particular catalyst being used, the polymer being produced, and the solvent being used, among other factors. In the example of the above equation using the Cp$_2$ZrMe$_2$/B(C$_6$F$_5$)$_3$ catalyst system for producing polyhexenyldecaborane, polymerization may be carried out between –75 to 25° C., preferably between 5 to 10° C., in a minimum of solvent. The amounts of catalyst and cocatalyst used may vary over a wide range, such as from between about 0.01 to 10 mol %, but preferably is about 1 mol % catalyst and slightly greater than 1 mol % cocatalyst. The polyhexenyldecaborane polymers may be isolated following reaction termination and column chromatography as solids that are reasonably air stable for extended periods relative to certain known precursors and are readily soluble in benzene and polar organic solvents.

As in connection with the molecular precursor, the substituting group may be solely a hydrocarbon, such as an alkyl group, or it may also include at least one additional ceramic forming element, either in the portion of the substituting group serving as the pendant group or in the portion serving as the polymeric backbone. As described below in Example 3, silicon may be this additional ceramic forming element included in the pendant group. More specifically, a polymeric precursor may be based on the monomer unit of a singly hydroborated diallyldimethylsilane, again catalyzed by Cp$_2$Ti(CO)$_2$. This monomer, 6-CH$_2$=CH–CH$_2$Si(CH$_3$)$_2$ (CH$_2$)$_3$–B$_{10}$H$_{13}$, with a free, terminal double bond, can be readily polymerized with the $Cp_2ZrMe_2/B(C_6F_5)_3$ catalyst system and then pyrolytically converted to a ceramic with a theoretical $B_4C:SiC$ ratio of 5:2. As discussed in connection with the molecular precursor, additional ceramic forming elements may be used, such as nitrogen or phosphorous. These additional ceramic forming elements may be included in either the pendant group or the polymer backbone.

Another route of forming a polymeric precursor is to form a copolymer formed by the copolymerization of a first monomer having a monosubstituted decaboranyl group and a second monomer. The second monomer may be a hydrocarbon or may also contain at least one additional ceramic forming element. Example 4 below describes the synthesis of a copolymer of hexenyldecaborane and allyltrimethylsilane formed by the polymerization catalyst system $Cp_2ZrMe_2/B(C_6F_5)_3$. The specific composition of a polymeric precursor formed by copolymerization of these two monomers can be altered to yield materials with varying SiC and $B_4C$ contents by varying the relative percentages of the two monomers used. In addition, if the second monomer is merely a hydrocarbon, then a boron carbide ceramic having a predetermined B:C ratio can be easily formed. For example, if a precise 4:1 B:C ratio is sought, two monomers having 2 and 3 carbon atoms associated with each might be used in a 50:50 mixture to form a precursor having a B:C ratio of 20:5, or 4:1.

The pyrolysis step of making the boron carbide ceramic of the present invention involves heating the precursor in a known way. The pyrolysis step is continued until the reaction of the precursor to its ceramic product has proceeded to completion or near completion. The end point for any given precursor can be easily determined by one skilled in the art empirically by analyzing the product formed by any suitable means, such as x-ray diffraction or elemental analysis. Alternatively or in addition to such empirical analysis, one may continue pyrolysis up until or shortly beyond the point at which the rate of weight loss of the precursor approaches zero with increasing heat. In some examples, this temperature has been identified to be about 600° C. Depending on the pyrolysis time and temperature, the resulting boron carbide containing ceramic product may be amorphous, nanocrystalline, microcrystalline, or macrocrystalline or hybrids thereof. Depending on the particular precursor and the desired form of the ceramic product, the pyrolysis step may be carried out at over a wide temperature range, such as between about 500° C. to 2,500° C., preferably between about 900° C. and 1200° C., and most preferably at or just above 1,000° C., for a time sufficient for reaction of substantially all of the precursor, such as about 0.2 to about 10 hours, more preferably between about 0.5 to 4 hours and most preferably about 1 to 3 hours. In general, the particular temperatures and times selected for the pyrolysis step vary with the particular ceramic being produced. The particular times and temperatures sufficient to achieve reaction to substantial completion of the reaction and a particular degree of crystallinity (if any is desired) can be easily determined empirically by one skilled in the art.

Figure 2:
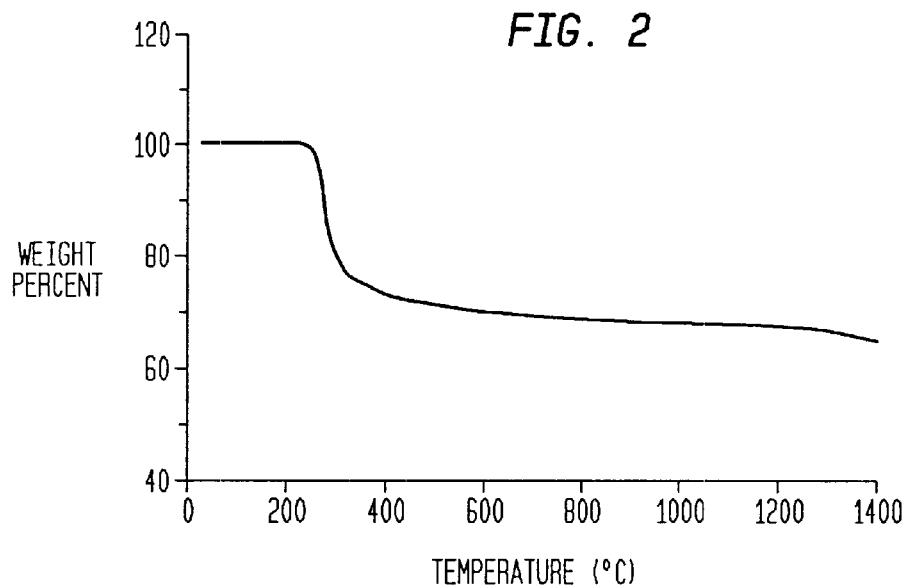
FIG. 2 is a graph depicting the weight loss upon heating of a polymeric precursor of the present invention.

Also, the precursors of the present invention remain in a processible form over a wide temperature range, both in its molecular and polymeric form. With respect to the polymeric precursor of the present invention for example. FIG. 2 is a graph showing the weight loss by TGA of polyhexenyldecaborane with increasing temperature, using a ramp rate of 10° C. under flowing argon. As shown in FIG. 2, thermal decomposition commences at around 250° C., but the glass transition temperature, Tg, is about 50–60° C. Decomposition is essentially complete at about 600° C. This leaves a wide temperature range (i.e., nearly a 200° C.) over which the precursor can be easily melt-processed. The breakdown of polyhexenyldecaborane yields: $B_4C+C_7H_{16}+16H_2$, with a theoretical ceramic yield of 68% (which assumes 100% chemical yield) and an observed ceramic yield of 65%. Elemental analysis of the boron carbide product formed from polyhexenyldecaborane reveals a relatively high carbon content boron carbide (i.e., having 78.45 weight percent boron).

Figure 3:
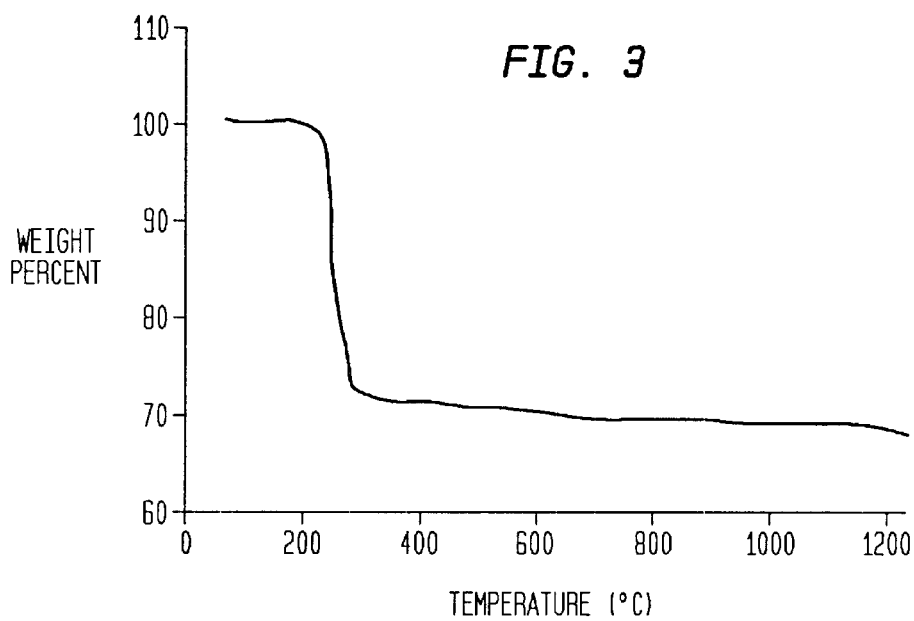
FIG. 3 is a graph depicting the weight loss upon heating of a molecular precursor of the present invention.

FIG. 3 depicts a graph showing the weight loss by TGA of $6,6'-(CH_2)_6-(B_{10}H_{13})_2$ with increasing temperature, using a ramp rate of 10° C. under flowing argon. This graph reveals that thermal decomposition of this molecular precursor occurs at about 220° C. while the melting point of the compound is about 96° C. Decomposition is essentially complete by 400° C. This leaves a wide range (i.e., nearly a 120° C.) over which the precursor can be easily processed. The breakdown of this molecular precursor yields: $5B_4C+CH_4+17H_2$, with a theoretical ceramic yield of 84.6% and an observed ceramic yield of 65%. Elemental analysis of the boron carbide product formed from this molecular precursor reveals that a relatively high boron content boron carbide is made (i.e., having 88.39 weight percent boron when pyrolyzed at 1000° C. and 89.04 weight percent boron when pyrolyzed at 1025° C.).

It has been found that pyrolyzing the molecular precursor of the formula $6,6'-(CH_2)_6-(B_{10}H_{13})_2$ for a time of three hours and at a temperature of 1025° C. is particularly preferable if a partially crystalline product is desired. Similarly, pyrolyzing the polyhexenyldecaborane for a time of one hour and at a temperature of 1250° C. showed the onset of crystallization and for a time of 10 hours and at a temperature of 1850° C. yielded highly crystalline materials. As described in U.S. Pat. No. 4,946,713, it is typically desirable to cross-link the precursors in the early stages of pyrolysis to provide a higher yield. This can be done in a known manner, for example by heating the precursors to temperatures in the range of 130° C. to 220° C. for a period of one to five hours.

Any known pyrolysis gas can be used to pyrolyze the precursors. For example, if boron carbide is sought and the substituting group is a hydrocarbon (with no other ceramic forming elements), then an inert gas, such as argon, may be used during pyrolysis. A composite material may be formed in at least two ways. The first way is when the substituting group contains at least one additional ceramic forming element (such as silicon, nitrogen, or phosphorous), and an inert gas is used as the pyrolysis gas. Alternatively, even if the substituting group contains no additional ceramic forming element, a composite material may be formed if a reactive gas is used as the pyrolysis gas. Such a reactive gas may be ammonia which, if used to pyrolyze a precursor of the present invention having a hydrocarbon substituting group (with no other ceramic forming elements), then a boron carbide/boron nitride composite can be formed. To form such a composite, the amount of nitrogen in the pyrolysis chamber should be less than that stoichiometrically required to form all boron nitride from the precursor to avoid forming all boron nitride. A phosphine gas may be used to form a born carbide/boron phosphide composite. Other combinations and pyrolysis gases may be used, such as gases containing silanes. The use of reactive gases to make such composites in this manner is well-known in the art.

As a precursor which can be processed, a variety of forms of ceramic can be made by the precursor of the present invention. Some of these forms include: fibers about 10–15 micrometers in diameter; thin films for thermoelectrics; thick films for abrasive coatings; coatings for oxidative and chemical protection; binders for ceramics; and nanostructured materials, such as nanofibers and nanotubes for reinforcement in a composite and nanoporous structures for use as high temperature catalyst supports and/or gas separation membranes. In its processible form, a precursor is applied to a substrate, for example, then pyrolyzed to form a coating.

In sum, the present invention provides precursors for boron carbide containing ceramics which are advantageous for at least the following reasons: (1) they are readily synthesized in large amounts using a catalyzed reaction; (2) they are stable as melts, thus allowing the use of melt-processing methods; and (3) upon pyrolysis, they undergo a crosslinking reaction at relatively low temperatures (for example, in one embodiment about 220° C.) that retards loss of material by volatilization, thereby generating high ceramic and chemical yields. Moreover, when the substituting group of the present invention is a hydrocarbon, the number of carbons in the substituting group can be adjusted to yield "carbon-rich" or "boron-rich" boron carbide compositions upon pyrolysis. Finally, precursors of the present invention are reasonably stable in air. With respect to their stability in air, most precursors of the present invention exhibit no observable decomposition in air at room temperature after four hours and less than 15% decomposition in air at room temperature after 24 hours.

Synthesis of Ceramic Spun Fibers and Spun Casting Films

As mentioned above, both the polymeric precursor of the present invention (e.g., polyhexenyldecaborane) and the molecular precursor of the present invention (e.g., 6,6'-$(CH_2)_6$-$(B_{10}H_{13})_2$) may be used to produce boron carbide in a variety of processed forms. The glass transition temperatures of the polyhexenyldecaboranes are in the 50–60° C. range, which is considerably below their initial decomposition temperatures, indicating that they have excellent stability for those applications requiring melt-processing. The precursors of the present invention can serve as single source precursors to boron carbide fibers.

With the wide temperature range over which the precursors of the present invention can be processed, any known spinning method can be used, such as those described in U.S. Pat. No. 4,810,436, incorporated herein by reference. Also, a simple laboratory ram extruder as described in Wideman et al., "Amine-Modified Polyborazylenes: Second-Generation Precursors to Boron Nitride," Chem. Mater., 1998, 10, 412–421, may be employed to continuously melt-spin (in the −80–120 range) 30 micrometer polyhexenyldecaborane fibers. Pyrolysis of these green fibers will then yield boron carbide fibers. The degree of fiber crystallinity can be controlled by the pyrolysis temperatures and both amorphous and crystalline fibers may be produced. These procedures may also be optimized as is well known in the In addition to the formation of melt spun fibers, the excellent solubility of the precursors of the present invention in organic solvents should also allow for the formation of fibers from dry-spinning techniques. Dry spinning involves the pumping of a viscous solution (100–1,000 Pa-s) of the polymer in the appropriate solvent through a spinneret. The fiber diameter is controlled by the rate of pumping of the solution, orifice diameter of the spinneret, and the speed of the draw wheels. As the solvent gradually evaporates during the extrusion and take up of the fiber, solvent-free green fibers remain ready for ceramic conversion via pyrolysis.

Boron carbide films may also be generated by using spin-casting methods well known in the art. One such spin casting method involves dissolution of the precursor in the appropriate solvent in a ratio necessary to obtain the desired viscosity. Viscosity of the solution directly influences the thickness of the coating; therefore, the viscosity may be varied to obtain the necessary thickness for the desired application. The precursor solution is applied to the desired substrate in liberal amounts following filtration of the solution. The solution coated substrate is then spun at rpms around 2,500 on commercially available spinners. The ceramic film is then obtained after removal of the solvent and pyrolysis under the appropriate conditions. These procedures may also be optimized as are well known. The fact that the polyhexenyldecaborane polymer and the 6,6'-$(CH_2)_6$-$(B_{10}H_{13})_2$ compound are precursors to "carbon-rich" and "boron-rich" boron carbide compositions, respectively, will allow the ceramic film compositions to be controlled and tuned to enhance properties such as thermoelectric efficiency.

Synthesis of Ceramic Nanofibers, Nanotubes and Nanoporous Structures

Recently, porous alumina templates have been used to generate nanofibers from a variety of materials including polymers, carbon, metals, semiconductors and ceramics. This template method, as shown in FIGS. 4a–4e, involves the absorption of a precursor material into the channels or pores of the nanoporous alumina using either gas-phase (CVD) or solution methods, conversion of the precursors to the final solid state material by thermolytic or chemical reactions, and then dissolution of the alumina membrane to leave the free standing fibers. This method may also be used to generate ceramic nanofibers using precursors of the present invention.

More specifically, FIG. 4a shows a side view of the alumina membrane 10 having alumina members 12 and pores 14. The alumina membrane may be, for example, about 60 microns in height (depicted as "h" in FIG. 4a), and pores 12 may be about 200 nanometers wide (depicted as "w" in FIG. 4a). The alumina membrane is immersed in a liquid precursor bath 16, as shown in FIG. 4b. Capillary action draws the precursor into pores 14, as shown in FIG. 4c. After pores 14 are filled with the precursor as shown in FIG. 4d, the precursor segments 16 are then pyrolyzed by heating. After pyrolysis, the alumina membrane is etched, for example by using 48% hydrofluoric acid, free standing boron carbide fibers 20 are formed and are aligned and monodispersed, as shown in FIG. 4e. Example 5 below explains how this technique was used to generate boron carbide nanofibers by employing 6,6'-$(CH_2)_6$-$(B_{10}H_{13})_2$ as the precursor.

As mentioned in Example 5 below, some of the products formed were nanocylinders (i.e., hollow) instead of nanofibers (i.e., solid). Another way of making nanocylinders may be to deposit boron carbide into the alumina template by CVD methods using either 6-hexenyldecaborane or 6-ethyldecaborane as a gas phase precursor, instead of completely filling the pores of the template with the liquid precursor. Others have, in fact, recently reported the formation of boron nitride nanocylinders in porous alumina templates using this CVD method with trichloroborazine as the precursor. Both 6-hexenyldeaborane and 6-ethyldecaborane are readily synthesized and volatile and, therefore, should make excellent CVD sources of boron carbide. Also, it should be pointed out that nanoporous alumina templates with even smaller channels (e.g., about 10–20 nm) have been prepared, and it may be possible to make correspondingly smaller boron carbide containing nanofibers and nanocylinders. In order to do so, the precursor is heated at a temperature sufficient to cause sublimation to form a gaseous precursor, which can then be deposited on a substrate using known CVD techniques.

Regarding nanoporous structures or membranes, the design of solids with ordered macroporosities has recently received great attention because of the possibility that such materials could potentially serve as photonic bandgap and optical stop-gap materials as well as catalyst supports and gas separation membranes. Although methods for producing ordered porous materials with pore diameters less than 10 nm have been well developed, it has been only recently that the techniques for producing macroporous (>25 nm) materials with uniform pore sized have been reported. These methods generally involve the controlled growth of a matrix around an ordered array of macroscale templates. Silica spheres, latex beads and triblock copolymers have each been employed as templates. Once thematrix structure is formed, the templates are then removed, by either chemical etching or thermal decomposition, to leave a macroporously ordered inorganic solid. For example, the latex beads have been used as templates to construct, via sol-gel condensations, ordered macroporous arrays of titania, zirconia, and alumina. Other work employing the silica templates have yielded macroporous carbons.

Figure 5A:
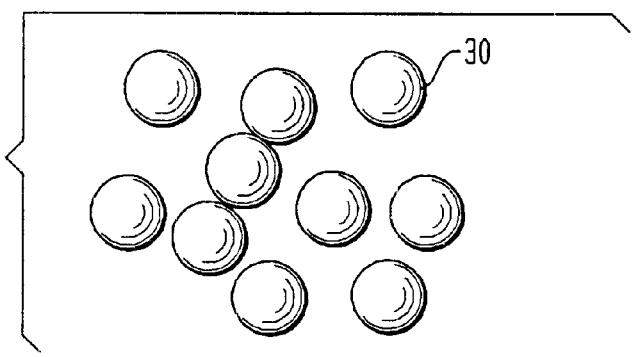
FIGS. 5a through 5e are schematic representations showing certain aspects of a process for forming ceramic nanoporous structures.
Figure 5B:
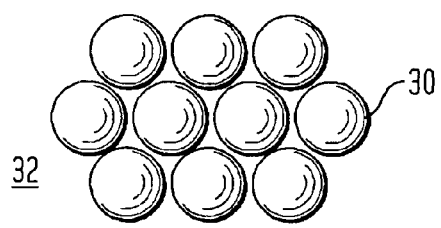
Figure 5C:
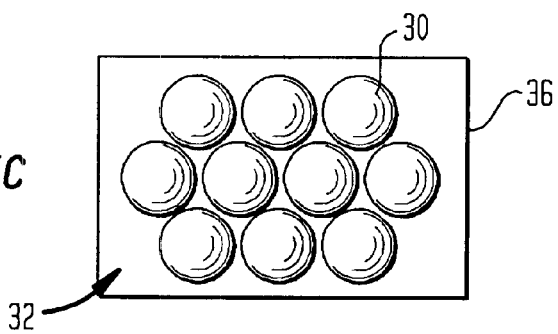
Figure 5D:
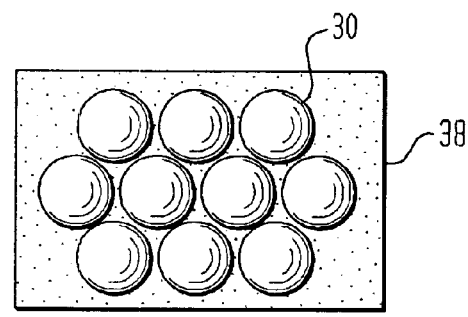
Figure 5E:
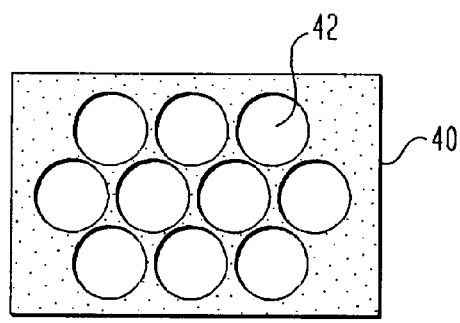

As shown in FIGS. 5a–5e, this templating technique may be used to make macroporous structures consisting of born carbide containing ceramics, such as boron carbide or boron carbide/silicon-carbide composites. As is well-known, such as is reported by Johnson, Stacey A.; Olliver, P. J.; Mallouk, T. F. *Science* 1999, 283, 963–965, a macro-ordered silica array may be prepared by initially generating a micro-emulsion of ~70 nm silica colloids 30 by controlled TEOS hydrolysis. Then following the Mallouk method, these emulsions are dried, pressed and sintered, as diagramed in the FIG. 5b, to yield a close-packed array 32 of silica spheres 30. The open space in this framework was then filled with the boron-carbide precursor 6,6'-$(CH_2)_6$-$(B_{10}H_{13})_2$ by immersion in a melt 36 of the compound, as shown in FIG. 5c. Pyrolysis of the filled body to 850° C., then yielded a boron carbide matrix 38 surrounding the silica spheres 30, as shown in FIG. 5d. The silica spheres were then etched from the matrix by treatment with 48% HF to leave a "holey" boron carbide framework or membrane 40 containing ~70 nm voids 42, as shown in FIG. 5e.

Analysis of boron carbide membrane 40 indicates a highly porous boron carbide framework with ~70 nm holes. The procedure may be optimized to both increase the ordering of the framework and achieve control of the hole size (through the use of different sized silica beads) of the boron carbide framework. Because of the high chemical and thermal stability of boron carbide, a high surface area micro-, meso-, or macroporous boron carbide framework may be extremely useful as a catalyst support or gas separation membrane. One limitation of a pure boron carbide material is its relatively low oxidation temperature; however, as discussed above, $B_4C/SiC$ composites have proven to have significantly enhanced oxidative stabilities. Thus, the invention contemplates using the silica bead templating method shown in FIGS. 5a–5e in conjunction with a boron silicon precursor of the present invention to generate new macroporous $B_4C/SiC$ frameworks for high temperature applications.

EXAMPLES

The following examples are included to more clearly demonstrate the overall nature of the invention. These examples are exemplary, not restrictive, of the invention.

EXAMPLE 1—Polyhexenyldecaborane Precursor

Polymerization reactions were carried out in a 100 mL Schlenk tube which was initially charged with a sample of 6-$CH_2$=CH-$(CH_2)_4$-$B_{10}H_{13}$ in air, then evacuated on a high-vacuum line. The Schlenk tube was sealed and removed to a glove box, where >1 mol % of $B(C_6F_5)_3$ was added. The reaction flask was then attached to a Schlenk line and a volume of benzene, equivalent to the volume of monomer, was added via syringe. While the mixture was maintained at 5–10° C., a 0.5 mL Benzene solution containing 1 mol % (relative to the amount of the sample) of $Cp_2ZrMe_2$ was quickly added via syringe under a positive pressure of nitrogen to the rapidly stirred solution of monomer and cocatalyst. The solution immediately turned dark red and was allowed to stir for the desired time while being maintained between 5–10° C. Termination was achieved by adding 5–10 mL of methanol and stirring for 15 min. while warming to room temperature.

All volatiles were vacuum evaporated and the polymer/monomer mixture was dried overnight in vacuo. Monomer, polymer and catalyst were then separated by column chromatography using Florosil with elution by ~250 mL of hexanes, followed by ~250 mL of $CH_2Cl_2$. Typically, ~70% conversion was observed for reactions employing 1 mol % $Cp_2ZrMe_2$ and a reaction time of 90 min. The polymers were isolated as white powders with $T_g$s in the range of 50–60° C. Anal. Calcd. for $(C_6H_{24}B_{10})_n$: C, 35.27; H, 11.84. Found: C, 35.76; H, 11.74. Analysis by $^{11}B$ NMR (64.2 MHz, $C_6D_6$) revealed: −24 (br s, 1, B6), 9.6 (overlapping d; 2, 1; B1, 3; B9), ⁻−0.8 (overlapping d, 2, B5, 7), −3.6 (d, 2, B8, 10), ⁻−36 ppm (overlapping d, 2, B2 and B4). Analysis by $^1H$ NMR (200 MHz, $C_6D_6$) revealed: 5.8 (trace, m, =CH-), 5.04 (trace, m, =$CH_2$), 1.80 (-$CH_2$-), 1.44 (backbone C—H), −1.9 (s, BHB), −2.4 (s, BHB). Analysis by DRIFT (KBr, cm$^{-1}$) revealed: 2926 (vs), 2841 (s), 2575 (vs), 1977 (w), 1937 (w), 1901 (w), 1550 (m, b), 1500 (s), 1443 (m, b), 1347 (w), 1095 (m), 1003 (s), 958 (m), 930 (w), 912 (w), 879 (vw), 853 (w), 838 (w), 812 (m), 721 (m), 705 (m), 680 (w), 639 (vw), 602 (vw).

Bulk polymer pyrolyses were carried out using a Lindberg 54000 series tube furnace with an Eurotherm 818 P temperature control unit. Polymer samples of 1–2 g were weighed into boron nitride boats, placed in an alumina pyrolysis tube, and then purged under a flow of ultra-high purity argon for 30 min. The samples were heated to the desired temperature at 10° C./min and, except as noted below, held at the final temperature for 1 h. The resulting ceramics were black and glassy. Ceramic yields at the indicated temperatures were: 1000° C, 66.7%; 1250° C. 64.7%; 1250° C. (10 h), 63.4%, 1450° C., 64.7%. Anal. Found: 1000° C., B, 75.63%; C, 23.99%; 1250° C., B, 75.41%; C, 25.22%; 1250° C. (10 h), B, 78.38%; C, 22.10%; 1450° C., B, 78.45%; C, 21.55%.

EXAMPLE 2—Dimethylsilane Dipropyldecaboranyl Precursor

A hydroboration reaction was carried out to produce dimethylsilane dipropyldecaboranyl, 6,6'$(CH_3)_2Si((CH_2)_3$-$B_{10}H_{13})_2$. 0.1603 g (0.6845 mmol, 7.61 mol %) of $Cp_2Ti(CO)_2$ catalyst were loaded into a 100 mL round bottom flask equipped with a vacuum adapter and stirbar inside the glovebox. The flask was removed to a Schlenk line where 1.10 g (9.00 mmol) of sublimed decaborane and 0.63 g of freshly distilled diallyldimethylsilane (4.5 mmol, dried and degassed over $CaH_2$) were added to the flask. The flask was removed to the high-vacuum line where 10 mL of freshly distilled toluene were statically transferred into the reaction flask at −196° C. The flask was evacuated, sealed and warmed to room temperature before submerging in a 88° C. oil bath. The reaction mixture was allowed to stir for 12 days. The reaction flask was cooled to room temperature and exposed to air. The reaction mixture was then flask filtered through a silica plug and eluted with benzene. The volatiles were removed under vacuum and 1.48 g (85.5% yield) of a peach solid remains.

The $^{11}$B NMR results are consistent with 6-R–$B_{10}H_{13}$ and show no presence of the parent decaborane or other substituted species. $^1$H NMR results show no presence of $CH_2$=CH protons and are consistent with a saturated diallyldimethylsilane. Pyrolysis in a TGA to 1100° C. at 10° C./min under a constant flow of high-purity argon reveals that weight loss begins around 200° C. and is essentially complete by 500° C., with a final ceramic yield of 63%. The theoretical composition of the ceramic product would have a $B_4C$:SiC ratio of 5:1.

EXAMPLE 3—
Polyallyldimethylsilanepropyldecaborane Precursor

To form 6-$CH_2$=CH–$CH_2$Si($CH_3$)$_2$($CH_2$)$_3$–$B_{10}H_{13}$, 0.1316 g (0.562 mmol, 4.57 mol %) of $Cp_2Ti(CO)_2$ catalyst were loaded into a 100 mL round bottom flask equipped with a vacuum adapter and stirbar inside the glovebox. The flask was removed to a Schlenk line where 1.50 g (12.3 mmol) of sublimed decaborane and 18 mL of freshly distilled diallyldimethylsilane (dried and degassed over $CaH_2$) were added to the flask. The flask was removed to the high-vacuum line where it was cooled to −196° C. and evacuated. The flask was then sealed, warmed to room temperature, and submerged in an 83° C. oil bath for 36 hours. The reaction flask was cooled to room temperature and exposed to air. The reaction mixture was then flash filtered through a silica plug and eluted with hexanes. The volatiles were removed under vacuum.

The $^{11}$B NMR results of the remaining solid, recovered in 92% yield, are consistent with 6-R–$B_{10}H_{13}$ and show no presence of the parent decaborane or other substituted species. The $^1$H NMR results show an integration consistent with hydroboration of one of the allyl groups. The molecular structure was confirmed by single crystal x-ray crystallographic determination.

To polymerize 6-$CH_2$=CH–$CH_2$Si($CH_3$)$_2$($CH_2$)$_3$–$B_{10}H_{13}$ and form polyallyldimethylsilanepropyldecaborane, a 2.21 g aliquot of 6-$CH_2$=CH–$CH_2$Si($CH_3$)$_2$($CH_2$)$_3$–$B_{10}H_{13}$ was pipeted into a 100 mL Schlenk tube, equipped with a Teflon stopcock and stirbar. The tube was evacuated on a high-vacuum line and removed to the glovebox where 0.050 g of $B(C_6F_5)_3$ were added. The pre-catalyst, 0.0212 g of $Cp_2ZrMe_2$, was weighed in the glovebox into a 25 mL two-neck roundbottom flask equipped with a vacuum adapter, stirbar, and septum. Both flasks were removed to the Schlenk line where 2.5 mL of dried, degassed benzene were syringed into the tube and 1.0 mL were syringed into the roundbottom. The Schlenk tube was cooled to 5–10° C. and the $Cp_2ZrMe_2$ solution was added with rapid stirring via syringe. The tube was stirred for 1.5 hours at 5–10° C. after which time the reaction was terminated and the tube allowed to warm to room temperature. After removing volatiles under vacuum, the monomer, polymer and catalyst were separated by column chromatography using Florosil and eluting with 750 mL of hexanes and 500 mL of methylene chloride. Volatiles were removed under vacuum and 1.29 g of polymer were recovered corresponding to a 58.4% conversion of monomer.

The $^{11}$B NMR results are consistent with 6-R–$B_{10}H_{13}$ and $^1$H NMR results show almost no $CH_2$=CH protons.

EXAMPLE 4—Copolymer of allyltrimethylsilane and hexenyldecaborane.

In order to form a copolymer of polyallyltrimethylsilane and polyhexenyldecaborane, 1.00 g (4.89 mmol) of hexenyldecaborane were pipeted into a 100 mL Schlenk tube and evacuated on a high-vacuum line. The tube was removed to the Schlenk line where 0.62 g (5.4 mmol) of allyltrimethylsilane (dried and degassed over $CaH_2$) were syringed into the tube. The tube was then degassed on the high-vacuum line and removed to the glovebox where 0.064 g (0.125 mmol) of $B(C_6F_5)_3$ were added. The pre-catalyst, 0.0270 g (0.107 mmol, 1.04 mol %) of $Cp_2ZrMe_2$, was weight in the glovebox into a 25 mL two-neck roundbottom flask equipped with a vacuum adapter, stirbar, and septum. Both flasks were removed to the Schlenk line where 0.75 mL of dried, degassed benzene were syringed into the tube and 0.50 mL were syringed into the roundbottom. The Schlenk tube was cooled to 5–10° C. and the $Cp_2ZrMe_2$ solution was added with rapid stirring via syringe. The tube was stirred for 1.5 hours at 5–10° C. after which time 6 mL of methanol were added to the tube and allowed to stir for 15 min at room temperature. Volatiles were removed under vacuum and the polymer precipitated from hexanes. The hexanes insoluble polymer, 0.11 g, was indicative of a 6.8% conversion.

The $^{11}$B NMR results are consistent with 6-R–$B_{10}H_{13}$ and the $^1$H NMR results show almost no $CH_2$=CH protons and show the signature peaks for both polyallyldimethylsilane and polyhexenyldecaborane.

EXAMPLE 5—Formation of Ceramic Nanofibers from Molecular Precursor

Alumina membranes (Whatman Anapore filters) having a thickness of 60 $\mu$m and a nominal pore size of ~200 nm (±50 nm) were used as the template. Pieces (~0.5 cm$^2$) of the membranes were immersed in liquid 6,6'-($CH_2$)$_6$–($B_{10}H_{13}$)$_2$ at 140° C. under a flow of nitrogen. Once the membrane was saturated, excess liquid was blotted from one side of the template. The filled templates were transferred to a boron nitride boat and then pyrolyzed in a tube furnace under a flow of high purity argon to 1025° C. at 10°/min and held at the final temperature for 3 hours. After cooling the sample overnight under a constant flow of argon, the alumina template was dissolved by immersing the sample in 48% hydrofluoric acid for 36 hours. The resulting nanofibers were then washed thoroughly with deionized water, methanol and acetone and dried overnight at 80° C. The fact that the fibers were not attacked by the HF treatment is in agreement with the chemical inertness of boron carbide.

Based on SEM images of a sample of nanofibers prepared as described above, the fibers appear to be uniform with dimensions of ~250 nm diameter of ~45 $\mu$m length. A thin layer of boron carbide was allowed to remain on one end of the fibers. This layer serves to hold the fibers in their parallel arrangement giving a highly-aligned, brush-like configuration. Thus, one of the advantages of the templating technique over other methods for generating nanofibers is its natural ability to produce aligned, monodispersed ensembles of nanofibers.

Based on X-ray diffraction spectrographs obtained from ~1 mg samples of the nanofibers heated at 1025° C. (top) and 1000° C. (bottom), respectively. While the 1000° C. fibers are largely amorphous, the observed diffraction pattern for the 1025° C. fibers confirms the onset of boron carbide crystallization. No diffraction is observed in either sample due to the alumina matrix confirming that it has been completely removed by the HF treatment. The observed diffraction patterns for both the 1025° C. and 1000° C. fibers are identical to those obtained upon heating bulk powder samples of 6,6'-$(CH_2)_6$-$(B_{10}H_{13})_2$ to the same temperatures.

In agreement with the XRD studies, TEM (Phillips EM400) analysis confirmed that the nanofibers heated at 1000° C. (3 h) were amorphous, but those taken to 1025° C. (3 h) showed the onset of boron carbide crystallization. The TEM images also showed that while almost all of the nanofibers were solid, there were some that had hollow cores. These nanocylindrical structures probably arise from incomplete filling of a channel in the template by the precursor. Such hollow fiber structures may prove useful for the construction of multicomponent nanofibers.

EXAMPLE 6—Formation of Ceramic Powders from Molecular Precursor

Bulk pyrolyses were carried out using a Lindberg 54000 series tube furnace with a Eurotherm 818P temperature control unit. One gram sample of 6,6'$(CH_2)_6$-$(B_{10}H_{13})_2$ were weighed into boron nitride boats, placed in the pyrolysis tube, and purged under a flow of ultra-high purity argon for 30 min. The samples were heated to the desired temperature at 10° C./min and held at the final temperature for three hours. The resulting ceramics were black and glassy. Ceramic yields at the indicated temperatures were: 1000° C., 62%; 1025° C., 60%. Anal. Found. 1000° C., B, 88.39%; C, 11.45% ($B_{7.7}C$); 1025° C., B, 89.04%; C, 10.76% ($B_{8.3}C$).

Although illustrated and described herein with reference to certain specific embodiments and examples, the present invention is nevertheless not intended to be limited to the details shown. Rather, the claims should be read to include various modifications within the scope and range of equivalents of the claims, without departing from the spirit of the invention.

What is claimed is:

1. A method for making a boron carbide containing ceramic comprising the steps of:
    forming a precursor comprising at least one monosubstituted decaboranyl groups and at least one substituting group containing carbon; and
    pyrolyzing said precursor to form said boron carbide containing ceramic.

2. The method in accordance with claim 1, wherein said precursor is a molecular precursor, said at least one monosubstituted decaboranyl groups comprises tow decaboranyl groups, and said at least one substituting group comprises one substituting group.

3. The method in accordance with claim 2, wherein said substituting group consists essentially of a hydrocarbon.

4. The method in accordance with claim 3, wherein said hydrocarbon comprises a six-carbon alkyl group, whereby said precursor is 6,6'-$(CH_2)_6(B_{10}H_{13})_2$.

5. The method in accordance with claim 2, wherein said substituting group comprises a hydrocarbon and at least one additional ceramic forming element, whereby said boron carbide containing ceramic is a composite containing boron carbide.

6. The method in accordance with claim 5, wherein said at least one additional ceramic forming element comprises silicon and said substituting group is dimethylsilanedipropyl.

7. The method in accordance with claim 1, wherein said precursor is a polymeric precursor comprising a polymeric backbone and a plurality of pendant groups, each of each pendant groups comprising at least one of said decaboranyl groups, and said polymeric backbone comprises a first portion of said substituting group.

8. The method in accordance with claim 7, wherein each of said pendant groups comprises a second portion of said substituting group.

9. The method in accordance with claim 8, wherein said substituting group further comprises at least one additional ceramic forming element, whereby said boron carbide containing ceramic is a composite containing boron carbide.

10. The method in accordance with claim 9, wherein said at least one additional ceramic forming element comprises silicon, said first portion comprises -$CH_2CH$- and said second portion comprises -$CH_2Si(CH_3)_2(CH_2)_3$-.

11. The method in accordance with claim 7, wherein said substituting group consists essentially of a hydrocarbon, wherein said boron carbide containing ceramic is boron carbide.

12. The method in accordance with claim 1, wherein said precursor is a polymeric precursor formed by the copolymerization of a first monomer having one of said monosubstituted decaboranyl groups and a second monomer.

13. The method in accordance with claim 12, wherein said first monomer is hexenyldecaborane and said second monomer is allyltrimethylsilane.

14. The method in accordance with claim 1, wherein the step of pyrolyzing comprises pyrolyzing said precursor to a temperature of at least 600° C.

15. The method in accordance with claim 1, wherein said substituting group consists essentially of a hydrocarbon and the step of pyrolyzing comprises using an inert gas, whereby said boron carbide containing ceramic is boron carbide.

16. The method in accordance with claim 1, wherein said substituting group consists essentially of a hydrocarbon and the step of pyrolyzing comprises using a reactive gas, whereby said boron carbide containing ceramic is a composite containing boron carbide.

17. The method in accordance with claim 1 further comprising, prior to the pyrolyzing step, melting said precursor and spinning said melted precursor to form fibers, whereby said boron carbide containing ceramic is in a form of melt spun fibers.

18. The method in accordance with claim 1 further comprising, prior to the pyrolyzing step, dissolving said precursor in an organic solvent and dry spinning the solution to form fibers, whereby said boron carbide containing ceramic is in a form of fibers.

19. The method in accordance with claim 1 further comprising, prior to the pyrolyzing step, dissolving said precursor and spinning said precursor solution on a substrate to form a spun cast film, whereby said boron carbide containing ceramic is in a form of said spun cast film.

20. The method in accordance with claim 1, further comprising:
    prior to the pyrolysis step, incorporating said precursor in an alumina template; and
    subsequent to the pyrolysis step, etching said alumina template, wherein said boron carbide containing ceramic is in a form of at least one of nanofibers and nanocylinders.

21. The method in accordance with claim 1, further comprising:
    prior to the pyrolysis step, forming said precursor around an array of silica spheres; and
    subsequent to the pyrolysis step, etching said silica spheres, wherein said boron carbide containing ceramic is in a form of a micro-, meso-, or macroporous membrane.

22. The method in accordance with claim 1, wherein said precursor is a molecular precursor and the method further comprises, prior to the pyrolysis step:

heating said molecular precursor to sublime said molecular precursor to form a gaseous precursor; and depositing said gaseous precursor on a substrate.

23. A method for making a boron carbide containing ceramic comprising the steps of:

forming a molecular precursor comprising two monosubstituted decaboranyl groups linked by a substituting group containing carbon; and pyrolyzing said molecular precursor to form said boron carbide containing ceramic.

24. The method in accordance with claim 23, wherein said substituting group consists essentially of a hydrocarbon, wherein said boron carbide containing ceramic is boron carbide.

25. The method in accordance with claim 23, wherein said substituting group comprises a hydrocarbon and at least one additional ceramic forming element, whereby said boron carbide containing ceramic is a composite containing boron carbide.

26. A method for making a boron carbide containing ceramic comprising the steps of:

forming a polymeric precursor comprising a polymeric backbone and a plurality of pendant groups each of said pendant groups comprising at least one monosubstituted decaboranyl group; and pyrolyzing said polymeric precursor to form said boron carbide containing ceramic.

27. The method in accordance with claim 26, wherein said polymeric backbone comprises a hydrocarbon and each of said pendant groups further comprises a hydrocarbon, wherein said boron carbide containing ceramic is boron carbide.

28. The method in accordance with claim 26, wherein said polymeric backbone comprises a two-carbon alkyl group and each of said pendant groups further comprises a four-carbon alkyl group, whereby said precursor is polyhexenyldecaborane.

29. The method in accordance with claim 26, wherein said polymeric backbone comprises a hydrocarbon and each of said pendant groups further comprises a hydrocarbon and at least one additional ceramic forming element, whereby said boron carbide containing ceramic is a composite containing boron carbide.

30. The method in accordance with claim 26, wherein said polymeric backbone comprises a hydrocarbon and at least one additional ceramic forming element and each of said pendant groups further comprises a hydrocarbon, wherein said boron carbide containing ceramic is boron carbide.

* * * * *

UNITED STATES PATENT AND TRADEMARK OFFICE
CERTIFICATE OF CORRECTION

PATENT NO. : 6,478,994 B1  Page 1 of 1
DATED : November 12, 2002
INVENTOR(S) : Larry G. Sneddon et al.

It is certified that error appears in the above-identified patent and that said Letters Patent is hereby corrected as shown below:

<u>Title page,</u>
Item [57], ABSTRACT,
Line 19, before "other", insert -- some --.

<u>Column 15,</u>
Line 49, delete "tow", and insert therefor -- two --.

<u>Column 16,</u>
Line 1, delete "each" (second occurrence), and insert therefor -- said --.

Signed and Sealed this

Nineteenth Day of August, 2003

JAMES E. ROGAN
*Director of the United States Patent and Trademark Office*